United States Patent
Jaiswal et al.

(10) Patent No.: US 10,468,084 B2
(45) Date of Patent: Nov. 5, 2019

(54) LOGIC-IN-MEMORY COMPUTATIONS FOR NON-VOLATILE RESISTIVE RANDOM ACCESS MEMORY (RAM) ARRAY

(71) Applicant: GLOBALFOUNDRIES INC., Grand Cayman (KY)

(72) Inventors: Akhilesh R. Jaiswal, West Lafayette, IN (US); Ajey Poovannumoottil Jacob, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/944,032

(22) Filed: Apr. 3, 2018

(65) Prior Publication Data

US 2019/0304528 A1    Oct. 3, 2019

(51) Int. Cl.
*G11C 11/16* (2006.01)
*H03K 19/16* (2006.01)

(52) U.S. Cl.
CPC ...... *G11C 11/1697* (2013.01); *G11C 11/1673* (2013.01); *H03K 19/16* (2013.01)

(58) Field of Classification Search
None
See application file for complete search history.

(56) References Cited

U.S. PATENT DOCUMENTS

2010/0039136 A1* 2/2010 Chua-Eoan ............ G11C 11/16
326/38
2017/0330070 A1* 11/2017 Sengupta .................. G06F 7/48

OTHER PUBLICATIONS

Borghetti, Julien et al., "'Memristive' switches enable 'stateful' logic operations via material implication", vol. 464, Apr. 8, 2010, doi:10.1038/nature08940, 4 pages.
Jain, Shubham et al. "Computing in Memory with Spin-Transfer Torque Magnetic RAM," School of Electrical and Computer Engineering, Purdue University, Nov. 21, 2017, arXiv:1703.02118v4, 14 pages.
Kang, Wang et al. "Stateful Reconfigurable Logic via a Single-Voltage-Gated Spin Hall-Effect Driven Magnetic Tunnel Junction in a Spintronic Memory", IEEE Transactions on Electron Devices, vol. 64, No. 10, Oct. 2017, 7 pages.

* cited by examiner

*Primary Examiner* — James G Norman
(74) *Attorney, Agent, or Firm* — David Cain; Andrew M. Calderon; Roberts Mlotkowski Safran Cole & Calderon, P.C.

(57) ABSTRACT

The present disclosure relates to a structure including a memory array circuit with a magnetic tunnel junction array and an inverter between at least two data magnetic tunnel junctions and configured to enable logic-in-memory computations.

20 Claims, 7 Drawing Sheets

LOGIC-IN-MEMORY COMPUTATIONS FOR NON-VOLATILE RESISTIVE RANDOM ACCESS MEMORY (RAM) ARRAY

FIELD OF THE INVENTION

The present disclosure relates to logic-in-memory arrays, and more particularly, to a circuit and a method for logic-in-memory computations for a non-volatile resistive random access memory (RAM) array.

BACKGROUND

Memory devices are employed as internal storage areas in a computer or other electronic equipment. One specific type of memory used to store data in a computer is random access memory (RAM). RAM is typically used as the major on-chip as well as off-chip storage unit in a computing system, and is generally volatile in that once power is turned off, all data stored in the RAM is lost.

In the computing environment, programs and data are held in memory (i.e., random access memory (RAM)). Further, the central processing unit (CPU) is separate from the memory and can perform computations and logic functions. In recent years, processor speeds have increased significantly and memory has improved in density (i.e., the ability to store more data in less space). However, as memory density and processor speeds have increased, the data transfer rate between the CPU and the memory has not improved much and created a bottleneck. The data transfer bottleneck between the CPU and the memory is called the von-Neumann bottleneck. In this scenario, the CPU will spend an increasing amount of time idle waiting for data to be fetched from memory. Overcoming this von-Neumann bottleneck will reduce latency and improve processing speeds in the computing environment.

SUMMARY

In an aspect of the disclosure, a structure includes a memory array circuit with a magnetic tunnel junction array and an inverter between at least two data magnetic tunnel junctions and configured to enable logic-in-memory computations.

In another aspect of the disclosure, a circuit includes a first data magnetic tunnel junction (data MTJ1), a second data magnetic tunnel junction (data MTJ2), and an inverter which is configured to be between the first data MTJ1 and the second data MTJ2 to create a voltage divider to mimic at least one logic operation.

In another aspect of the disclosure, a method includes turning on a power supply on a first row which is connected to a first data magnetic tunnel junction (data MTJ1) in a memory array circuit to provide a current flow through a second row which is connected to a second data magnetic tunnel junction (data MTJ2) in the memory array circuit, and configuring an inverter switching threshold of an inverter between the first data MTJ1 and the second data MTJ2 to create a voltage divider to mimic a logic operation in the memory array circuit.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to logic-in-memory arrays, and more particularly, to a circuit and a method for logic-in-memory computations for a random access memory (RAM) array. In more specific embodiments, the present disclosure overcomes the von-Neumann bottleneck by implementing in-memory computing operations. For example, the present disclosure allows for logic-in-memory computations for a one transistor-one magnetic tunnel junction (1T-1MTJ) array. In other examples, the present disclosure also allows for logic-in-memory computations for a phase change memory (PCM) or a resistive random-access memory (ReRAM).

In conventional circuitry, a cross-point architecture can be used to provide for logic-in-memory computations. However, in the cross-point approach, data can be destroyed and is prone to sneak paths. Further, in another approach, multiple sense amplifiers can be used per column for logic-in-memory computations. However, this approach has a poor sensing margin, is limited by the relative resistances of the access transistors and the memory element and requires complex circuitry. Lastly, in another approach of the conventional circuitry, only one data is stored in memory and the other is applied as external electrical excitation. In this approach, data has to be read first, then a logic operation can be evaluated, and required data may have to be written again. In contrast, in the present disclosure, the circuit and method has a non-data destructive method, almost no change to the 1T-1MTJ array, better and robust sensing without a need for a multiple sense-amplifier per column, and the flexibility of implementing multiple logical operations.

In the present disclosure, a voltage divider sensing methodology is used for in-memory computations. For example, the present disclosure can implement material implication (IMP) logic, NAND/NOR logic, and XOR logic. Further, the present disclosure has a better sensing scheme for carrying out logical operations than conventional circuitry. Also, the present disclosure requires minimal changes to the 1T-1MTJ bit-cell structure (i.e., not increasing area or complexity).

Figures 1, 2:
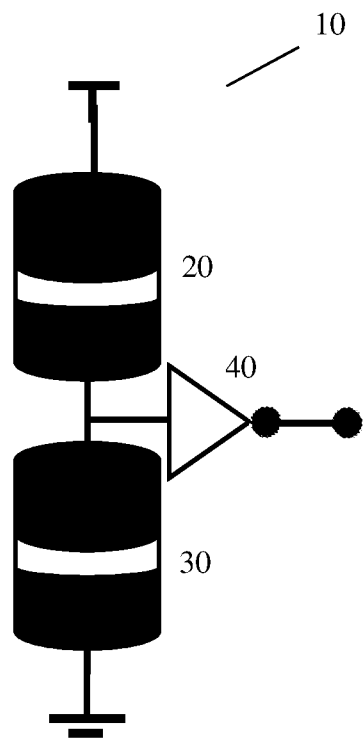
FIG. 1 shows an overview of a first memory array in accordance with aspects of the present disclosure.
FIG. 2 shows a logic table for the first memory array in accordance with aspects of the present disclosure.

FIG. 1 shows an overview of a first memory array in accordance with aspects of the present disclosure. In FIG. 1, a first memory array 10 includes a first data magnetic tunnel junction (data MTJ1) 20, a second data magnetic tunnel junction (data MTJ2) 30, and an inverter 40. The inverter 40 can include a PMOS device and a NMOS device. The thresholds of the PMOS device and the NMOS device in the inverter 40 can be skewed/adjusted to mimic a material implication (IMP) operation or an OP-01 operation. For example, the thresholds of the PMOS device and the NMOS device can be skewed/adjusted so that the PMOS device is stronger than the NMOS device (or vice-versa). In another example, the PMOS device and the NMOS device of the inverter 40 can be selected with different thresholds. As shown in FIG. 1, the inverter 40 is placed between the first data MTJ1 20 and the second data MTJ2 30 to create a voltage divider to mimic an IMP operation or an OP-01 operation.

FIG. 2 shows a logic table for the first memory array in accordance with aspects of the present disclosure. In FIG. 2, the logic table 50 can include first data A and second data B. For example, the first data A can correspond to the first data MTJ1 20 and the second data B can correspond to the second data MTJ2 30 of FIG. 1. Therefore, in the logic table 50, the material implication (IMP) operation is 0 only when the first data A (i.e., first data MTJ1 20) is 1 and the second data B (i.e., second data MTJ2 30) is 0. However, if the first data A (i.e., first data MTJ1 20) is 0 and the second data B (i.e., second data MTJ2 30) is 1, then the IMP operation is 1. The IMP operation is also 1 when both the first data A (i.e., first data MTJ1 20) and the second data B (i.e., second data MTJ2 30) are the same value (i.e., either 1 or 0).

Figure 3:
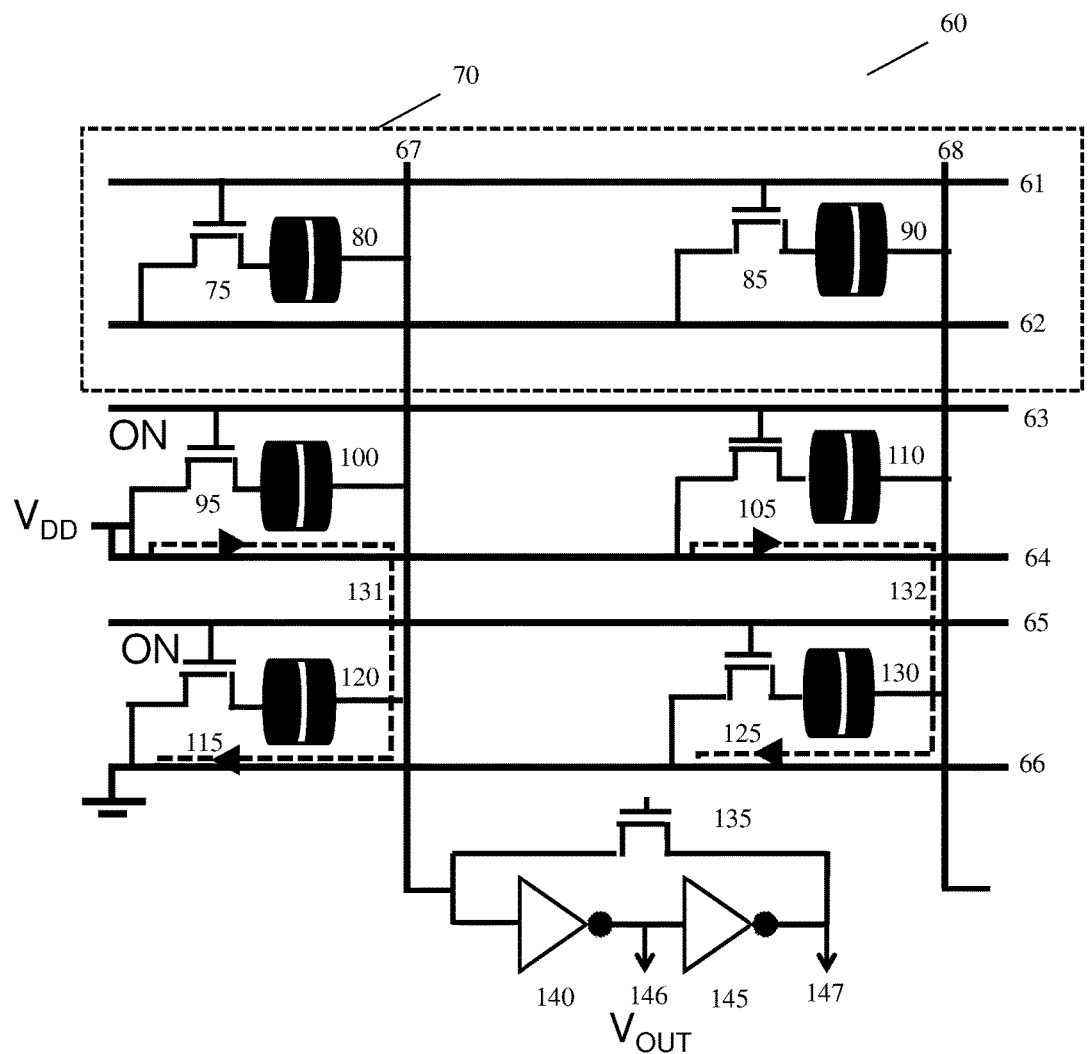
FIG. 3 shows an implementation of the first memory array in accordance with aspects of the present disclosure.

FIG. 3 shows an implementation of the first memory array in accordance with aspects of the present disclosure. In FIG. 3, the first memory array 60 includes a reference row 70 which includes a NMOS transistor 75 with a drain in series and coupled to a first reference data MTJ1 80 and a NMOS transistor 85 with a drain in series and coupled to a second reference data MTJ2 90. Further, in FIG. 3, the first memory array 60 includes a NMOS transistor 95 with a drain in series and coupled to a first data MTJ1 100. The first memory array 60 also includes a NMOS transistor 105 with a drain in series and coupled to a third data MTJ3 110 and a NMOS transistor 115 with a drain in series and coupled to a second data MTJ2 120. Further, the first memory array 60 includes a NMOS transistor 125 with a drain in series and coupled to a fourth data MTJ4 130. Lastly, a NMOS transistor 135 is in parallel with inverters 140, 145. In FIG. 3, one set of inverters 140, 145 and NMOS transistor 135 are needed for every column line. Further, after the first inverter, more complex sense-amplifiers can be used, if required.

In FIG. 3, the row line 61 is connected to the gate of NMOS transistors 75, 85 and is OFF. The row line 62 is connected to the source of NMOS transistors 75, 85. The row line 63 is connected to the gate of NMOS transistors 95, 105 and is ON. The row line 64 is connected to the voltage power supply VDD and the source of NMOS transistors 95, 105. The row line 65 is connected to the gate of NMOS transistors 115, 125 and is ON. The row line 66 is connected to ground and the source of NMOS transistors 115, 125. The column line 67 is connected to the first reference data MTJ1 80, the first data MTJ1 100, the second data MTJ2 120, and the inverter 140. The column line 68 is connected to the second reference data MTJ2 90, the third data MTJ3 110, and the fourth data MTJ4 130. Lastly, the NMOS transistor 135 has a source connected to the input of the inverter 140 and a drain connected to the output of the inverter 145.

In operation, as the row lines 63, 65 are turned ON, current flows from the voltage power supply VDD on row 64 through column 67 and towards ground on row 66, as indicated by dashed lines 131 and 132. Therefore, during operation, the first memory array 60 will approximate the array 10 in FIG. 1 and can be used for the IMP operation (as shown in the logic table 50 in FIG. 2). During this operation, the row line 61 of the reference row 70 is turned OFF. The NMOS transistor 135 is initially turned OFF during the logic computation. Once the logic computation is accomplished, row lines 63 and 65 are turned OFF, while transistor 135 is turned ON, in order to latch the resultant computed data in the inverters 140 and 145.

In other words, assuming that the first data MTJ1 100 is 0 (i.e., corresponding to A in the logic table 50) and the second data MTJ2 120 is 0 (i.e., corresponding to B in the logic table 50), then $V_{OUT}$ is 1 (i.e., IMP operation in the logic table 50). In FIG. 3, 0 corresponds to high resistance of the MTJ and 1 corresponds to low resistance of the MTJ. In FIG. 3, $V_{OUT}$ is at node 146, which is an output for an IMP operation. Further, inverter 145 is used to latch the data from $V_{OUT}$ at node 146. Further, assuming that the first data MTJ1 100 is 0 and the second data MTJ2 120 is 1, then $V_{OUT}$ is 1. Moreover, assuming that the first data MTJ1 100 is 1 and the second data MTJ2 120 is 1, then $V_{OUT}$ is 1. Lastly, if the first data MTJ1 100 is 1 and the second data MTJ2 120 is 0, then $V_{OUT}$ is 0. Accordingly, the first data MTJ1 100 and the second data MTJ2 120 in the first memory array 60 are configured using an inverter 140 with a specific switching threshold (i.e., adjusting/skewing the PMOS and NMOS thresholds of the inverter 140) to mimic an IMP operation.

Figure 4:
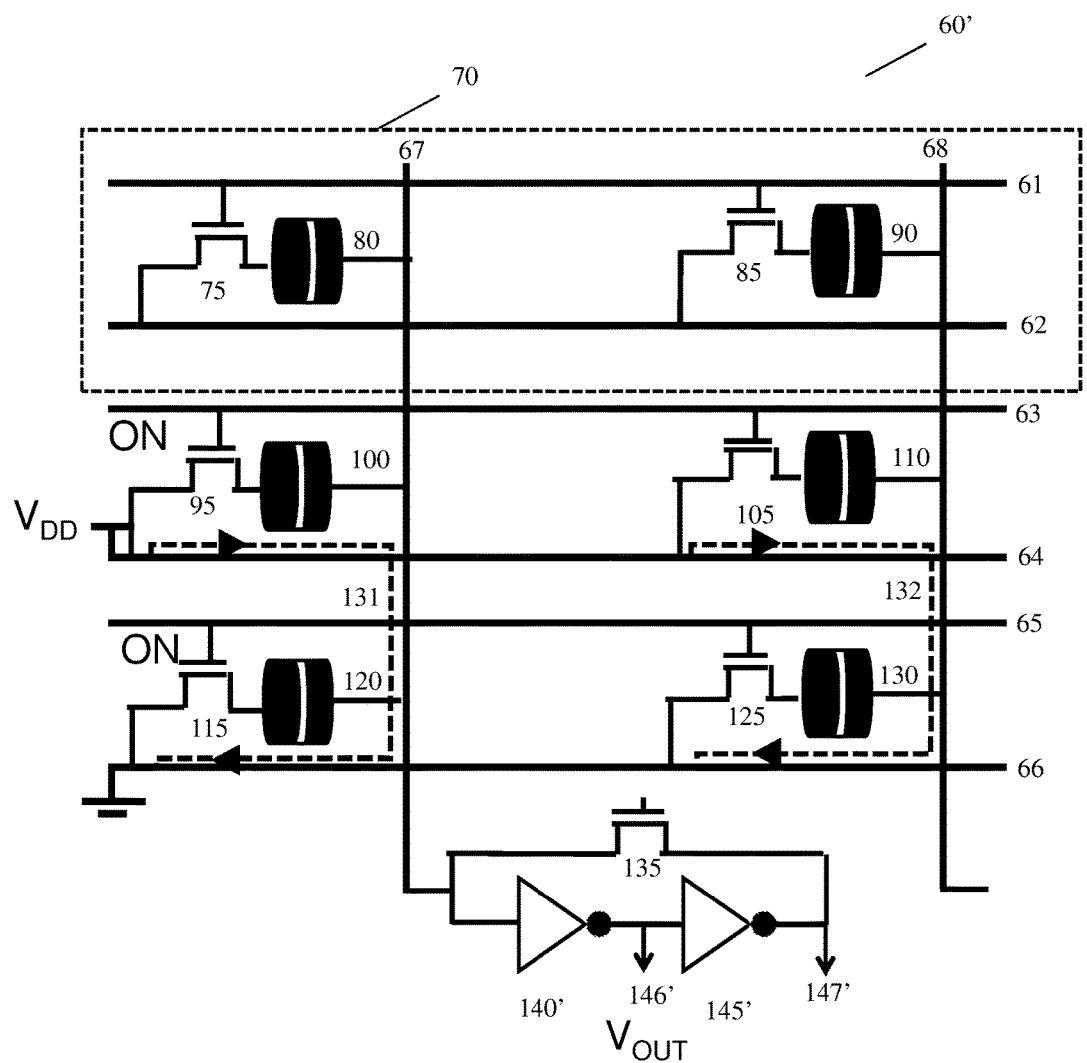
FIG. 4 shows another implementation of the first memory array in accordance with aspects of the present disclosure.

FIG. 4 shows another implementation of the first memory array in accordance with aspects of the present disclosure. FIG. 4 is similar to FIG. 3 except that the first memory array 60' of FIG. 4 is configured using an inverter 140' with a different (i.e., opposite) switching threshold than the inverter 140 in FIG. 3 to mimic an OP-01 operation. In FIG. 4, the output (i.e., $V_{OUT}$) at node 146' is the output of the OP-01 operation. Further, the output (i.e., $V_{OUT}$) at node 146' in the OP-01 operation is 1 only when the MTJ1 100 is 0 and the second data MTJ2 120 is 1.

In operation, as the row lines 63, 65 are turned ON in FIG. 4, current flows from VDD on row 64 through column 67 and towards ground on row 66, as indicated by dashed lines 131 and 132. Therefore, during operation, the first memory array 60' will approximate the array 10 in FIG. 1 and can be used for the OP-01 operation. During this operation, the row line 61 of the reference row 70 is turned OFF.

In other words, assuming that the first data MTJ1 100 is 0 (i.e., corresponding to A in the logic table 50) and the second data MTJ2 120 is 0 (i.e., corresponding to B in the logic table 50), then $V_{OUT}$ is 0 (i.e., the result of the OP-01 operation). $V_{OUT}$ is at node 146', which is an output for the OP-01 operation. Further, assuming that the first data MTJ1 100 is 0 and the second data MTJ2 120 is 1, then $V_{OUT}$ is 1. Moreover, assuming that the first data MTJ1 100 is 1 and the second data MTJ2 120 is 1, then $V_{OUT}$ is 0. Lastly, if the first data MTJ1 100 is 1 and the second data MTJ2 120 is 0, then $V_{OUT}$ is 0. Accordingly, the first data MTJ1 100 and the second data MTJ2 120 in the first memory array 60' are configured using an inverter 140' with a specific switching threshold (i.e., skewing/adjusting the PMOS and NMOS thresholds of the inverter 140') to mimic the OP-01 operation. Further, the inverter 140' of FIG. 4 is configured with an inverter switching threshold which is opposite to the inverter switching threshold of the inverter 140 in FIG. 3 to mimic the OP-01 operation.

The inverters 140, 145, 140', and 145' of FIGS. 3 and 4 can be used in parallel to implement an XOR operation. In particular, inverters 140' and 145' of FIG. 4 can be used in parallel to implement an XOR operation. In other words, when using an OR gate to the outputs (which correspond to node 146 in FIG. 3 and node 146' in FIG. 4) of the first memory array 60 and the first memory array 60' (which are connected in parallel), an XOR operation can be implemented. In particular, ORing the output of the IMP operation (i.e., node 146) of the first memory array 60 and the output of the OP-01 operation (i.e., node 146') of the first memory array 60' can give the XOR operation in a single cycle. As one of ordinary skill in the art would understand, the IMP and XOR operations comprise a universal gate for all of Boolean operations.

A two cycle read operation can be used with IMP and XOR operations. For example, in the logic table 50 of FIG. 2, IMP is low (i.e., 0) only when the first data A (i.e., first data MTJ1 20) is 1 and the second data B (i.e., second data MTJ2 30) is 0. Therefore, in FIG. 3, node 146 (i.e., the output of the IMP operation) is 0 only when the first data A (i.e., the first data MTJ1 100) is 1 and the second data B (i.e., the second data MTJ2 120) is 0. Further, node 147 in FIG. 3 is 1 only when the first data A (i.e., the first data MTJ1 100) is 1 and the second data B (i.e., the second data MTJ2 120) is 0. In FIG. 3, node 147 is 1 when node 146 is 0 because there is an inverter connecting node 146 to node 147.

In FIG. 4, the node 146' (i.e., the output for the OP-01 operation) goes high (i.e., 1) only when the first data A (i.e., the first data MTJ1 100) is 0 and the second data B (i.e., the second data MTJ2 120) is 1. As described above, inverters 140, 145, 140', and 145' of FIGS. 3 and 4 can be used in parallel to implement an XOR operation. In addition to in-memory computing, two outputs (i.e., node 147 and node 146') go high (i.e., 1) only when the first data A is 1 and the second data B is 0 for node 147 and when the first data A is 0 and the second data B is 1 for node 146'. Thus, sensing the 0 for the first data A and 1 for the second data B or sensing the 1 for the first data A and 0 for the second data B allows for in-memory computing.

An additional advantage of the present disclosure is that if the output corresponding to the first data A being 0 and the second data B being 1 is high (i.e., the output is 1), then the first data MTJ1 100 is 0 and the second data MTJ2 120 is 1. This scenario is a two bit read operation instead of the typical one bit read operation. Therefore, in the process of performing in-memory computing, if the first data A is 0 and the second data B is 1 or the first data A is 1 and the second data B is 0, then a two bit read operation is performed. On the other hand, if the first data A is 0 and the second data B is 0 or if the first data A is 1 and the second data B is 1, a second read operation is needed to identify these cases. In other words, if an output (i.e., node 147 or node 146') goes high (i.e., 1) corresponding to either the first data A being 0 and the second data B being 1 or the first data A being 1 and the second data B being 0, then a two-bit read operation has been performed.

Figures 5, 6:
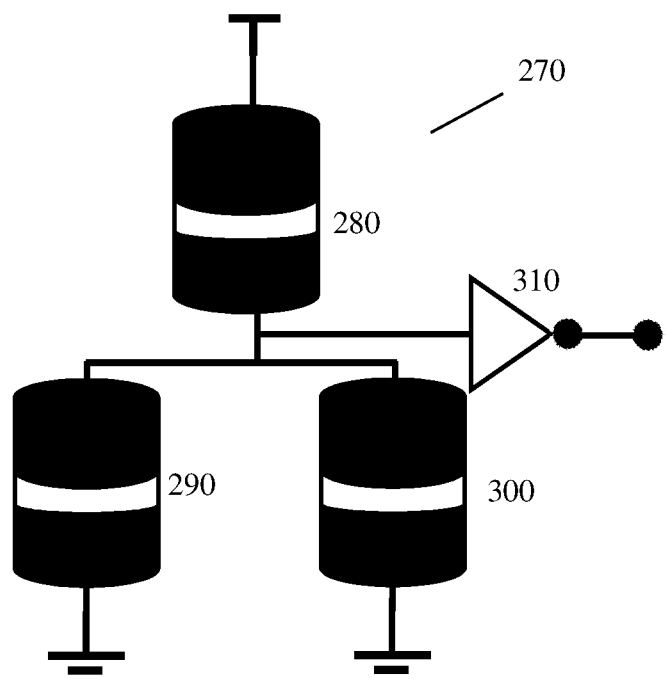
FIG. 5 shows an overview of a second memory array in accordance with aspects of the present disclosure.
FIG. 6 shows a logic table for the second memory array in accordance with aspects of the present disclosure.

FIG. 5 shows an overview of a second memory array in accordance with aspects of the present disclosure. In FIG. 5, the second memory array 270 includes a first reference data magnetic tunnel junction (reference data MTJ1) 280, a first data magnetic tunnel junction (data MTJ1) 290, a second data magnetic tunnel junction (data MTJ2) 300, and an inverter 310. As shown in FIG. 5, the inverter 310 is placed between the first reference data MTJ1 280, the first data MTJ1 290, and the second data MTJ2 300 to create a voltage divider to mimic a NAND or NOR operation.

In FIG. 5, the inverter 310 can include a PMOS device and a NMOS device. The thresholds of the PMOS device and the NMOS device in the inverter 310 can be skewed/adjusted to mimic a NAND or NOR operation. For example, the thresholds of the PMOS device and the NMOS device can be skewed/adjusted so that the PMOS device is stronger than the NMOS device (or vice-versa). In another example, the PMOS device and the NMOS device of the inverter 310 can be selected with different thresholds. In FIG. 5, the thresholds of the inverter 310 can also be adjusted/skewed to mimic a NAND operation or adjusted/skewed in the opposite direction (as the NAND operation) to mimic a NOR operation.

FIG. 6 shows a logic table for the second memory array in accordance with aspects of the present disclosure. In FIG. 6, the logic table 320 can include first data A corresponding to the first data MTJ1 290 and second data B corresponding to the second data MTJ2 300. Therefore, in the logic table 320, the NAND operation is 0 only when the first data A (i.e., first data MTJ1 290) is 1 and the second data B (i.e., second data MTJ2 300) is 1. However, if the first data A (i.e., first data MTJ1 290) is 0 and the second data B (i.e., second data MTJ2 300) is 1, then the NAND operation is 1. The NAND operation is 1 when both the first data A (i.e., first data MTJ1 290) and the second data B (i.e., second data MTJ2 300) are both 0. Lastly, the NAND operation is 1 when the first data A (i.e., first data MTJ1 290) is 1 and the second data B (i.e., second data MTJ2 300) is 0.

In FIG. 6, in the logic table 320, the NOR operation is 1 only when the first data A (i.e., first data MTJ1 290) is 0 and the second data B (i.e., second data MTJ2 300) is 0. However, if the first data A (i.e., first data MTJ1 290) is 0 and the second data B (i.e., second data MTJ2 300) is 1, then the NOR operation is 0. Further, the NOR operation is 0 when the first data A (i.e., first data MTJ1 290) is 1 and the second data B (i.e., second data MTJ2 300) is 0. Lastly, the NOR operation is 0 when the first data A (i.e., first data MTJ1 290) is 1 and the second data B (i.e., second data MTJ2 300) is 1.

Figure 7:
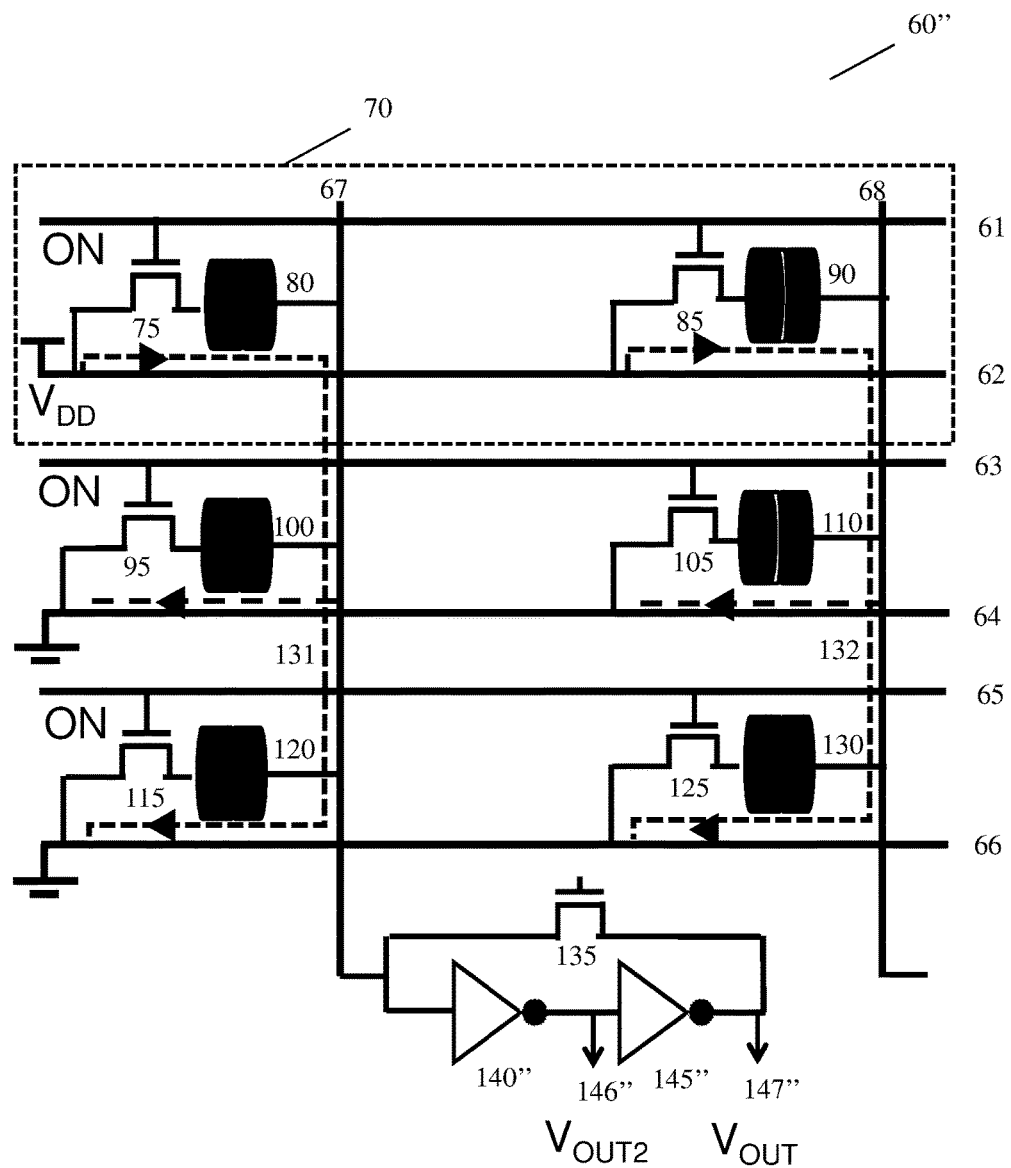
FIG. 7 shows an implementation of the second memory array in accordance with aspects of the present disclosure.

FIG. 7 shows an implementation of the second memory array in accordance with aspects of the present disclosure. FIG. 7 is similar to FIG. 3 except the reference row 70 also includes a row line 61 which is turned ON. In operation, as the row lines 61, 63, 65 are turned ON, current flows from VDD on row 62 through column 67 and towards ground on rows 64, 66 as indicated by dashed lines 131 and 132. Therefore, during operation, the second memory array 60" will approximate the array 270 in FIG. 5 and can be used for the NAND or NOR operation (as shown in the logic table 320 in FIG. 6) depending on the configuration of the inverter 140" (i.e., the skew of an inverter switching threshold of the inverter 140"). During this operation, none of the row lines 61, 63, and 65 are turned OFF.

In other words, assuming that the first data MTJ1 100 is 0 (i.e., corresponding to A in the logic table 320) and the second data MTJ2 120 is 0 (i.e., corresponding to B in the logic table 320), then $V_{OUT}$ is 1 in a NAND operation (i.e., NAND operation in the logic table 320) and is 1 in a NOR operation (i.e., NOR operation in the logic table 320). In FIG. 7, $V_{OUT}$ is at node 147", which is an output for a NAND or NOR operation, depending on how the inverters are skewed. Also, in FIG. 7, $V_{OUT}2$ is at node 146", which is an output for an AND or OR operation, depending on how the inverters are skewed. Further, assuming that the first data MTJ1 100 is 0 and the second data MTJ2 120 is 1, then $V_{OUT}$ is 1 in a NAND operation (i.e., NAND operation in the logic table 320) and is 0 in a NOR operation (i.e., NOR operation in the logic table 320). Assuming that the first data MTJ1 100 is 1 and the second data MTJ2 120 is 1, then $V_{OUT}$ is 0 in a NAND operation (i.e., NAND operation in the logic table 320) and is 0 in a NOR operation (i.e., NOR operation in the logic table 320). Lastly, if the first data MTJ1 100 is 1 and the second data MTJ2 120 is 0, then $V_{OUT}$ is 1 in a NAND operation (i.e., NAND operation in the logic table 320) and is 0 in a NOR operation (i.e., NOR operation in the logic table 320). In other words, the first data MTJ1 100 and the second data MTJ2 120 in the second memory array 60" are configured using an inverter 140" with a specific switching threshold (i.e., skewing/adjusting the PMOS and NMOS thresholds of the inverter 140") to mimic either a NAND operation or a NOR operation (the operation depends on adjusting/skewing of an inverter switching threshold of the inverter 140"). In particular, the threshold of the inverter 140" can be skewed in one direction for a NAND operation and in the other direction for the NOR operation.

In FIG. 7, an XOR operation can be implemented when NORing the output of the AND operation (corresponding to node 146") and the output of the NOR operation (corresponding to node 147"). Also, an XOR operation can be given in a single cycle by NORing the output of the AND operation (corresponding to node 146") and the output of the NOR operation (corresponding to node 147"). As one of ordinary skill in the art would understand, the NAND and NOR operations comprise a universal gate for all of the Boolean operations, including the XOR operation.

Figure 8:
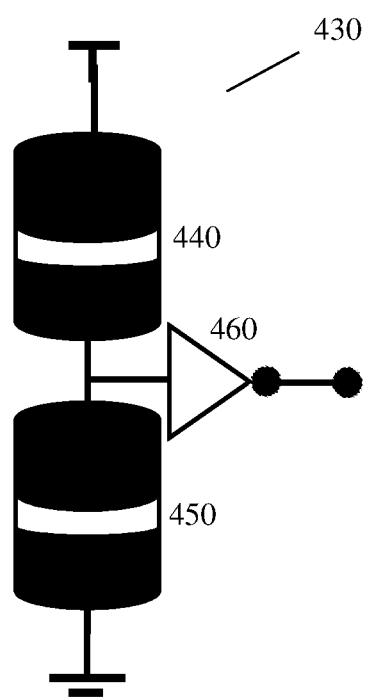
FIG. 8 shows an overview of a third memory array in accordance with aspects of the present disclosure.

FIG. 8 shows an overview of a third memory array in accordance with aspects of the present disclosure. In FIG. 8, the overview of the third memory array 430 includes a first reference data magnetic tunnel junction (reference data MTJ1) 440, a second data magnetic tunnel junction (data MTJ2) 450, and an inverter 460. As shown in FIG. 8, the inverter 460 is placed between the first reference data MTJ1 440, and the second data MTJ2 450 to create a voltage divider to mimic a read operation.

In FIG. 8, the inverter 460 can include a PMOS device and a NMOS device. The thresholds of the PMOS device and the NMOS device in the inverter 460 can be skewed/adjusted to mimic a read operation. For example, the thresholds of the PMOS device and the NMOS device can be skewed/adjusted so that the PMOS device is stronger than the NMOS device (or vice-versa). In another example, the PMOS device and the NMOS device of the inverter 460 can be selected with different thresholds.

Figure 9:
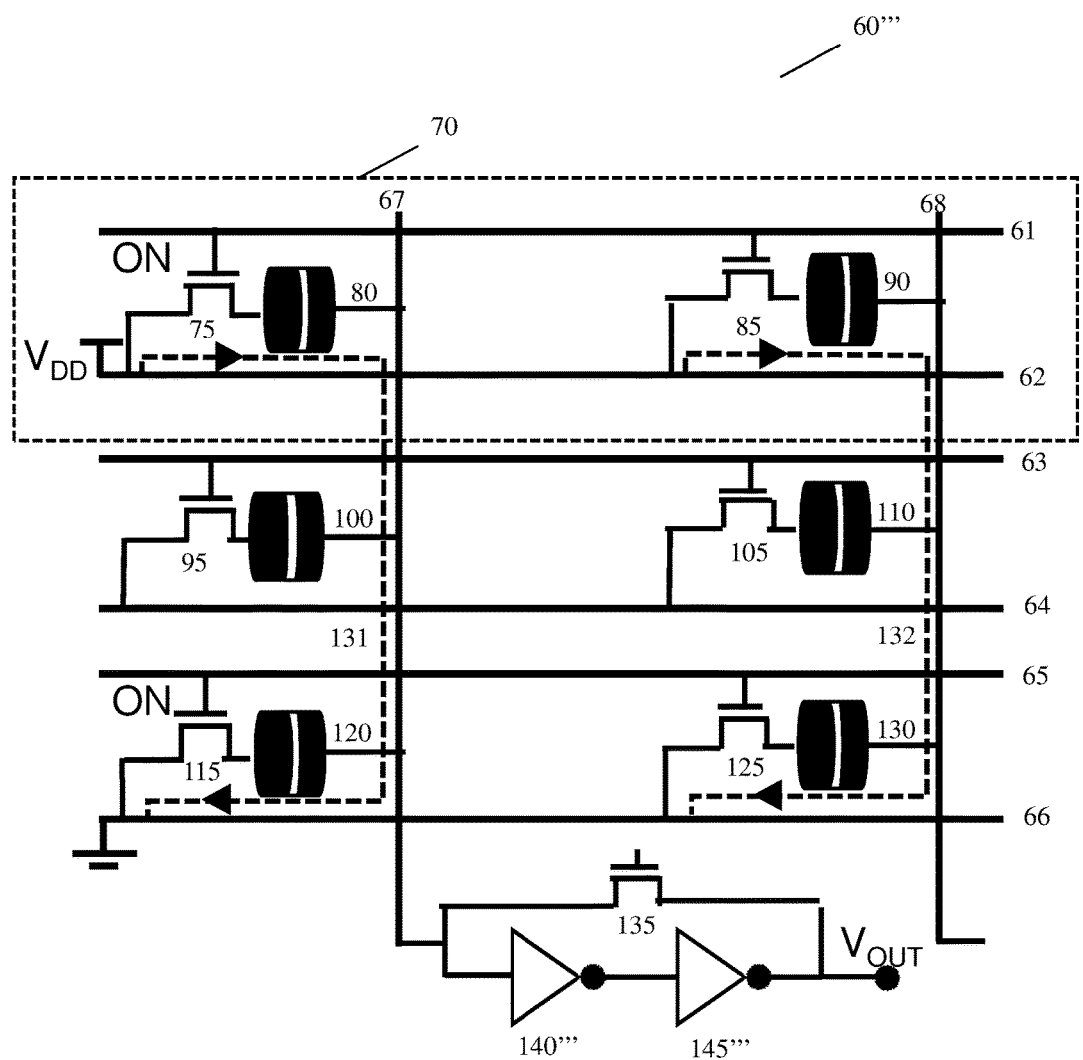
FIG. 9 shows an implementation of the third memory array in accordance with aspects of the present disclosure.

FIG. 9 shows an implementation of the third memory array in accordance with aspects of the present disclosure. FIG. 9 is similar to FIG. 1 except only the row lines 61 and 65 are turned ON. In operation, as the row lines 61, 65 are turned ON, current flows from VDD on row 62 through column 67 and towards ground on row 66 as indicated by dashed lines 131 and 132. Therefore, during operation, the third memory array 60''' will approximate the array 430 in FIG. 8 and can be used for a read operation. During this read operation, the row line 63 is turned OFF and the threshold of the inverter 140''' is adjusted/skewed to perform the read operation. $V_{OUT}$ is the output of the inverter 145".

FIGS. 8 and 9 describe how the memory array, which has been discussed earlier for in-memory computation, can also be used for a normal read operation. In FIG. 8, the first reference data magnetic tunnel junction (reference data MTJ1) 440 is a reference data MTJ1 and the second data magnetic tunnel junction (data MTJ2) 450 is a data MTJ2 to be read. Therefore, based on the voltage divider and the skewing of the inverter 460, the voltage of a middle node can be sensed.

For example, when the second data MTJ2 450 in FIG. 8 has a 0 state, the output of the inverter 460 would be 0. In contrast, when the second data MTJ2 450 has a 1 state, the output of the inverter 460 would be 1. Thus, the third memory array 430 can be used to determine the value (either 0 or 1) of the second data MTJ2 450. The third memory array 430 can accomplish a normal read operation in one cycle. In this one cycle operation, the first reference data MTJ1 440 is always fixed and its resistance is irrelevant to the normal read operation.

The circuit and the method for logic-in-memory computations of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for logic-in-memory computations of the present disclosure has been adopted from integrated circuit (IC) technology. For example, the structures are built on wafers and are realized in films of material patterned by photolithographic processes on the top of a wafer. In particular, the fabrication of the circuit and the method for logic-in-memory computations uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Further, the circuit and the method for logic-in-memory computations of the present disclosure can have wide applicability in high throughput processors for machine learning and artificial intelligence.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
a memory array circuit with a magnetic tunnel junction array including:
an inverter between at least two data magnetic tunnel junctions and configured to enable logic-in-memory computations;
a first NMOS transistor which has a gate connected to a first row line and a source connected to a first reference data magnetic tunnel junction (reference data MTJ1);

a second NMOS transistor which has a gate connected to a second row line and a source connected to a first data magnetic tunnel junction (data MTJ1) of the at least two data magnetic tunnel junctions; and a third NMOS transistor which has a gate connected to a third row line and a source connected to a second data magnetic tunnel junction (data MTJ2) of the at least two data magnetic tunnel junctions.

2. The structure of claim 1, wherein the memory array circuit comprises the data MTJ1, the data MTJ2, and the inverter connected to a first column.

3. The structure of claim 2, wherein the inverter comprises a PMOS device and a NMOS device, and the inverter is configured to be between the first data MTJ1 and the second data MTJ2 to create a voltage divider to mimic at least one logic operation.

4. The structure of claim 3, wherein an inverter switching threshold of the inverter is adjusted by adjusting thresholds of the PMOS device and the NMOS device to mimic a material implication (IMP) operation.

5. The structure of claim 3, wherein an inverter switching threshold of the inverter is adjusted by adjusting thresholds of the PMOS device and the NMOS device to mimic an OP-01 operation.

6. The structure of claim 1, wherein the memory array circuit comprises the first reference data magnetic tunnel junction (reference data MTJ1), the first data magnetic tunnel junction (data MTJ1), the second data magnetic tunnel junction (data MTJ1), and the inverter connected to a first column.

7. The structure of claim 6, wherein the inverter comprises a PMOS device and a NMOS device, and the inverter is configured to be between the first reference data MTJ1, the first data MTJ1, and the second data MTJ2 to create a voltage divider to mimic at least one logic operation.

8. The structure of claim 7, wherein an inverter switching threshold of the inverter is adjusted by adjusting thresholds of the PMOS device and the NMOS device to mimic a NAND operation.

9. The structure of claim 7, wherein an inverter switching threshold of the inverter is adjusted by adjusting thresholds of the PMOS device and the NMOS device to mimic a NOR operation.

10. The structure of claim 1, wherein the memory array circuit is a resistive random access memory (ReRAM).

11. The structure of claim 1, further comprising:
a fourth NMOS transistor which has a gate connected to the first row line and a source connected to a second reference data magnetic tunnel junction (reference data MTJ2);
a fifth NMOS transistor which has a gate connected to the second row line and a source connected to a third data magnetic tunnel junction (data MTJ3) of the at least two data magnetic tunnel junctions; and
a sixth NMOS transistor which has a gate connected to the third row line and a source connected to a fourth data magnetic tunnel junction (data MTJ4) of the at least two data magnetic tunnel junctions.

12. A circuit, comprising:

a first NMOS transistor which has a gate connected to a first row line and a source connected to a first reference data magnetic tunnel junction (reference data MTJ1);
a second NMOS transistor which has a gate connected to a second row line and a source connected to a first data magnetic tunnel junction (data MTJ1);
a third NMOS transistor which has a gate connected to a third row line and a source connected to a second data magnetic tunnel junction (data MTJ2); and
an inverter which is configured to be between the first data MTJ1 and the second data MTJ2 to create a voltage divider to mimic at least one logic operation.

13. The circuit of claim 12, wherein an inverter switching threshold of the inverter is adjusted by adjusting thresholds of a PMOS device and a NMOS device of the inverter to mimic a material implication (IMP) operation.

14. The circuit of claim 12, wherein an inverter switching threshold of the inverter is adjusted by adjusting thresholds of a PMOS device and a NMOS device of the inverter to mimic an OP-01 operation.

15. The circuit of claim 14, wherein the OP-01 operation is further configured to mimic an XOR operation in the circuit.

16. The circuit of claim 12, wherein the inverter comprises a PMOS device and a NMOS device, and the inverter is further configured to be between the first reference data MTJ1, the first data MTJ1, and the second data MTJ2 to create the voltage divider to mimic the at least one logic operation.

17. The circuit of claim 16, wherein an inverter switching threshold of the inverter is adjusted by adjusting thresholds of a PMOS device and a NMOS device of the inverter to mimic a NAND operation.

18. The circuit of claim 16, wherein an inverter switching threshold of the inverter is adjusted by adjusting thresholds of a PMOS device and a NMOS device of the inverter to mimic a NOR operation.

19. The circuit of claim 12, wherein the circuit is a resistive random access memory (ReRAM).

20. A method, comprising:
configuring a first row which is connected to a gate of a first NMOS transistor which has a source connected to a reference data magnetic tunnel junction (reference data MTJ1);
turning on a power supply on a second row which is connected to a gate of a second NMOS transistor which has a source connected to a first data magnetic tunnel junction (data MTJ1) in a memory array circuit to provide a current flow through a third row which is connected to a gate of a third NMOS transistor which has a source connected to a second data magnetic tunnel junction (data MTJ2) in the memory array circuit; and
configuring an inverter switching threshold of an inverter between the first data MTJ1 and the second data MTJ2 to create a voltage divider to mimic a logic operation in the memory array circuit.

* * * * *